US006838707B2

(12) United States Patent
Chang (10) Patent No.: US 6,838,707 B2
(45) Date of Patent: Jan. 4, 2005

(54) BI-DIRECTIONAL SILICON CONTROLLED RECTIFIER FOR ELECTROSTATIC DISCHARGE PROTECTION

(75) Inventor: Chyh-Yih Chang, Hsinghuang (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/138,405

(22) Filed: May 6, 2002

(65) Prior Publication Data

US 2003/0205761 A1 Nov. 6, 2003

(51) Int. Cl.⁷ .......................... H01L 29/74; H01L 29/76
(52) U.S. Cl. ................ 257/120; 257/119; 257/122; 257/173; 257/396
(58) Field of Search ............................. 257/395–396, 257/510, 119–122, 355–363, 173; 361/56; 327/310, 428

(56) References Cited

U.S. PATENT DOCUMENTS

| | | | |
|---|---|---|---|
| 4,939,616 A | | 7/1990 | Rountree |
| 5,012,317 A | | 4/1991 | Rountre |
| 5,150,187 A | * | 9/1992 | Huang ........................ 257/359 |
| 5,225,702 A | | 7/1993 | Chatterjee |
| 5,453,384 A | | 9/1995 | Chatterjee |
| 5,465,189 A | | 11/1995 | Polgreen et al. |
| 5,502,328 A | | 3/1996 | Chen et al. |
| 5,519,242 A | | 5/1996 | Avery |
| 5,572,394 A | * | 11/1996 | Ker et al. ...................... 361/56 |
| 5,581,104 A | | 12/1996 | Lowrey et al. |
| 5,629,544 A | | 5/1997 | Voldman et al. |
| 5,631,793 A | | 5/1997 | Ker et al. |
| 5,646,808 A | | 7/1997 | Nakayama |
| 5,654,862 A | | 8/1997 | Worley et al. |
| 5,719,737 A | | 2/1998 | Maloney |
| 5,754,381 A | | 5/1998 | Ker |
| 5,807,791 A | | 9/1998 | Bertin et al. |
| 5,811,857 A | | 9/1998 | Assaderaghi et al. |
| 5,903,420 A | * | 5/1999 | Ham ........................... 361/56 |
| 5,907,462 A | | 5/1999 | Chatterjee et al. |
| 5,910,874 A | | 6/1999 | Iniewski et al. |

(List continued on next page.)

OTHER PUBLICATIONS

S.Voldman, et al., "Semiconductor Process and Structural Optimization of Shallow Trench Isolation–Defined and Polysilicon– Bound Source/Drain Diodes for ESD Networks," in Proc. of EOS/ESD Symp., 1988, pp. 151–160.

S. Voldman, et al., "Analysis of Snubber–Clamped Diode–String Mixed Voltage Interface ESD Protection Network for Advanced Microprocessors," in Proc. of EOS/ESD symposium, 1995, pp. 43–61.

M. J. Pelgrom, et al., "A 3/5 V Compatible I/O Buffer," IEEE Journal of Solid–State Circuits, vol. 30, No. 7, pp. 823–825, Jul. 1995.

(List continued on next page.)

*Primary Examiner*—Ori Nadav
(74) *Attorney, Agent, or Firm*—Finnegan, Henderson, Farabow, Garrett & Dunner, L.L.P.

(57) ABSTRACT

A bi-directional silicon controlled rectifier formed in a silicon layer and disposed over shallow trench isolations and therefore electrically isolated from the substrate to be insensitive to substrate noise for electrostatic discharge protection an electrostatic discharge protection device that includes a semiconductor substrate, including a first p-type portion, a first n-type portion contiguous with the first p-type portion, a second p-type portion contiguous with the first p-type portion and the first n-type portion, a second n-type portion, a third p-type portion, a third n-type portion contiguous with the third p-type portion, and a fourth p-type portion contiguous with the third p-type portion and the third n-type portion, wherein at least one of the first p-type portion, second p-type portion, third p-type portion, fourth p-type portion, first n-type portion, second n-type portion, and third n-type portion overlaps the isolation structure.

19 Claims, 8 Drawing Sheets

U.S. PATENT DOCUMENTS

| | | | |
|---|---|---|---|
| 5,932,918 | A | 8/1999 | Krakauer |
| 5,940,258 | A | 8/1999 | Duvvury |
| 5,990,520 | A | 11/1999 | Noorlag et al. |
| 6,015,992 | A | 1/2000 | Chatterjee et al. |
| 6,034,397 | A | 3/2000 | Voldman |
| 6,081,002 | A | 6/2000 | Amerasekera et al. |
| 6,258,634 | B1 | 7/2001 | Wang et al. |

OTHER PUBLICATIONS

G.P. Singh, et al., "High–Voltage–Tolerant I/OBuffers with Low–Voltage CMOS Process," IEEE Journal of Solid–State Circuits, vol. 34, No. 11, pp. 1512–1525, Nov. 1999.

H. Sanchez, et al., A Versatile 3.3/2.5/1.8–V CMOS I/O Driver Built in 02. –µm, 3.5–nm Tox, 1.8 –V CMOS Technology, IEEE Journal of Solid–State Circuits, vol. 34, No. 11.pp. 1501–1511, Nov. 1999.

C. Richier, P. Salome, G. Mabboux, I. Zaza, A. Juge, and P. Mortin, Investigation on Different ESD Protection Strategies Devoted to 3.3V RF Applications (2 (GHz) in a 0.18 µm CMOS Process, in Proc. of EOS/ESD Symp., 200, pp. 251–259.

T.–Y. Chen and M.–D. Ker, "Design on ESD Protection Circuit With Low and Constant Input Capacitance," in Proc. of IEEE Int. Symp. on Quality Electronic Design, 2001, pp. 247–247.

M.–D. Ker, T.–Y. Chen, C.–Y. Wu, and H.–H. Chang, ESD Protection Design on Analog Pin With Very Low Input Capacitance for RF or Current–Mode Applications, IEEE Journal of Solid–State Circuits, vol. 35, pp. 1194–1199, 2000.

N. K. Verghese and D. Allstot, "Verification of RF and Mixed–Signed Integrated Circuits for Substrate Coupling Effects", in Proc. of IEEE Custom Integrated Circuits Conf:, 1997, pp. 363–370.

M.Xu, D. Su, D. Shaeffer, T.Lee, and B. Wooley, Measuring and Modeling the Effects of Substrate Noise on LNA for a CMOS GPS Receiver, IEEE Journal of Solid–State Circuits, vol. 36, pp. 473–485, 2001.

R. Gharpurey, "A Methodology for Measurement and Characterization of Substrate Noise in High Frequency Circuits", in Proc. of IEEE Custom Integrated Circuits Conf., 1999, pp. 487–490.

M. Nagata, J. Nagai, K. Hijikata, T. Morie, and A. Iwata, PhysicalDesign Guides for Substrate Noise Reduction in CMOS Digital Circuits, IEEE Journal of Solid–State Circuits, vol. 36, pp. 539–549, 2001.

M.–D. Ker, T–Y, Chen, C–Y. Wu, and H.–H. Chang, ESD Protection Design on Analog Pin WIth Very Low Input Capacitance for High–Frequency or Current–Mode Applications, IEEE Journal of Solid–State Circuits, vol. 35, pp. 1194–1199, 2000.

M.–D. Ker, Whole–Chip ESD Protection Design with Efficient VDD–to–VSS ESD Clamp Circuit for Submicron CMOS VLSI, IEEE Trans. on Electron Devices, vol. 46, pp. 173–183, 1999.

M.–D. Ker, et al., "CMOS On–Chip ESD Protection Design with Substrate–triggering Technique," Proc. of ICECS, vol. 1, pp. 273–276, 1998.

C. Duvvury et al., "Dynamic Gate Coupling for NMOS for Efficient Output ESD Protection", Proc. of IRPS, pp. 141–150, 1992.

* cited by examiner

BI-DIRECTIONAL SILICON CONTROLLED RECTIFIER FOR ELECTROSTATIC DISCHARGE PROTECTION

DESCRIPTION OF THE INVENTION

Field of the Invention

This invention pertains in general to a semiconductor device, and, more particularly, to a bi-directional silicon controlled rectifier.

BACKGROUND OF THE INVENTION

A semiconductor integrated circuit ("IC") is generally susceptible to an electrostatic discharge ("ESD") event, which may damage or destroy the IC. An ESD event refers to a phenomenon of electrical discharge of a current (positive or negative) for a short duration, during which a large amount of current is provided to the IC. The high current may be built-up from a variety of sources, such as the human body. Many schemes have been implemented to protect an IC from an ESD event. Examples of known ESD protection schemes are shown in FIGS. 1 and 2.

In deep-submicron complementary metal-oxide semiconductor ("CMOS") process technology with shallow-trench isolations ("STIs"), a silicon controlled rectifier ("SCR") has been used for ESD protection. A feature of an SCR is its voltage-holding ability. An SCR can sustain high current and hold the voltage across the SCR at a low level, and may be implemented to bypass high-current discharges associated with an ESD event.

Figure 1:
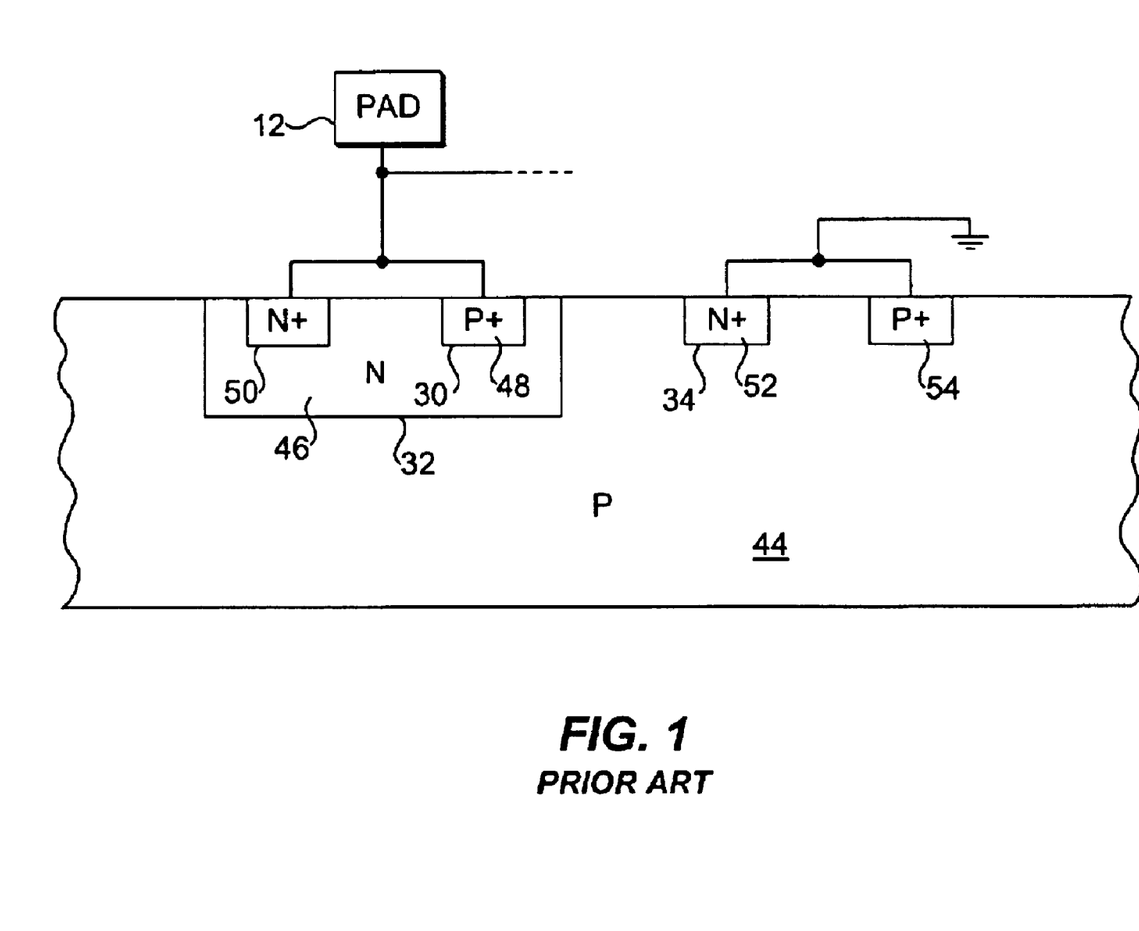
FIG. 1 shows a cross-sectional view of a known silicon controlled rectifier structure formed in an integrated circuit.

FIG. 1 is a reproduction of FIG. 3 of U.S. Pat. No. 5,012,317 to Rountre, entitled "Electrostatic Discharge Protection Circuit." Rountre describes a lateral SCR structure made up of a P$^+$ type region 48, an N-type well 46, a P-type layer 44, and an N$^+$ region 52. According to Rountre, a positive current associated with an ESD event flows through region 48 to avalanche a PN junction between well 46 and layer 44. The current then flows from layer 44 to region 52 across the PN junction and ultimately to ground, to protect an IC from the ESD event. However, a disadvantage of the SCR structure shown in FIG. 1 is its susceptibility to being accidently triggered by a substrate noise, resulting in device latch-up.

Figure 2:
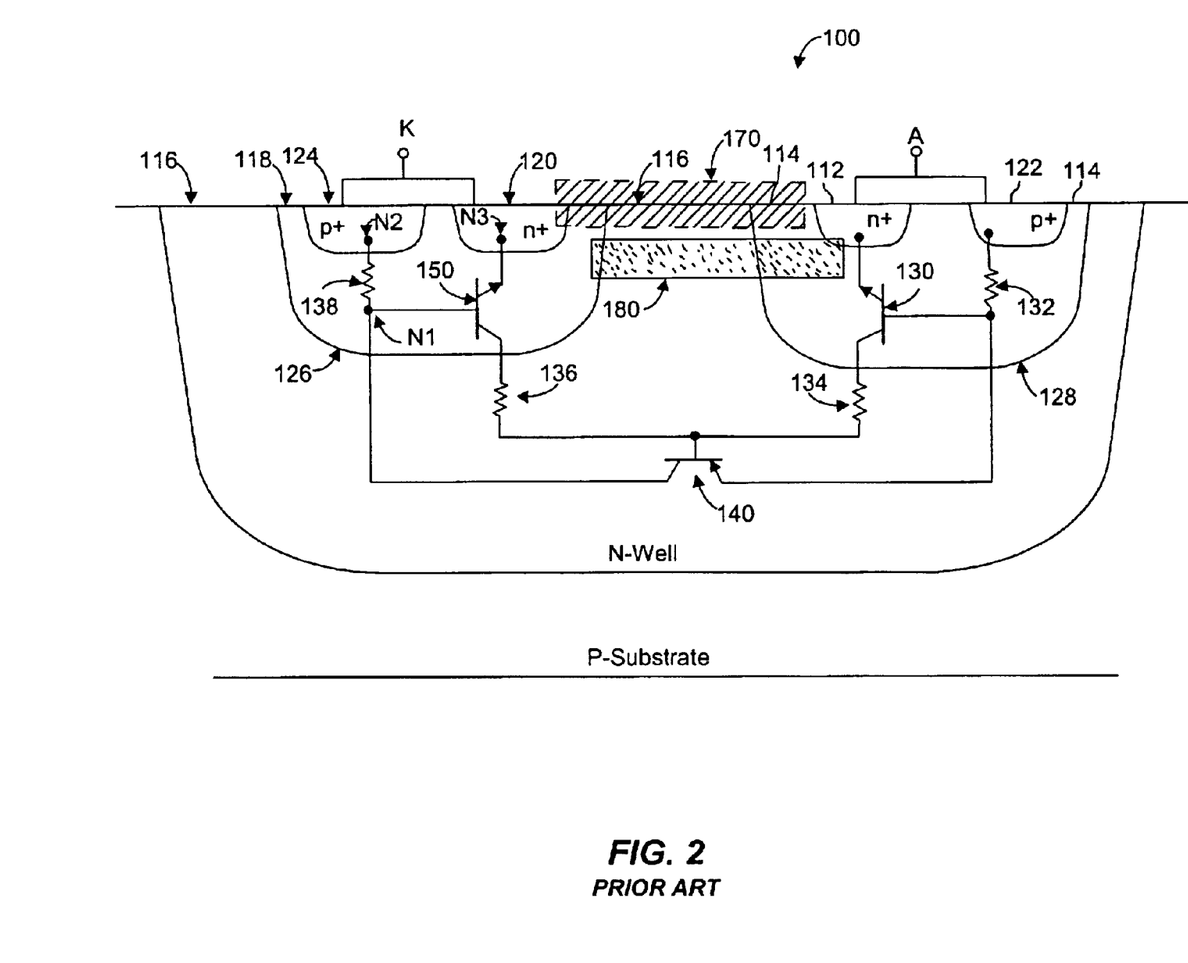
FIG. 2 shows a cross-sectional view of another known silicon controlled rectifier structure formed in an integrated circuit.
Figure 3:
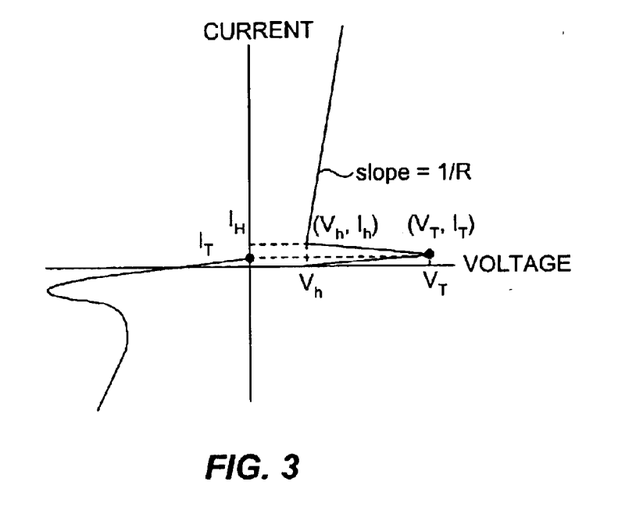
FIG. 3 shows the current-voltage characteristic of the silicon controlled rectifier structure shown in FIG. 2.

FIG. 2 is a reproduction of FIG. 5 of U.S. Pat. No. 6,258,634 (the '634 patent) to Wang, entitled "Method for Manufacturing a Dual-Directional Over-Voltage and Over-Current Protection Device and Its Cell Structure." The '634 patent describes a two-terminal ESD protection structure providing protection against both positive and negative ESD pulses that may appear across an anode A and a cathode K. When a positive pulse is applied across terminals A and K, transistors 140 and 150 turn on. Thereafter SCR 170, defined by p-n-p-n regions 114, 116, 118 and 120, is triggered into a snap-back mode. Alternatively, when a negative pulse is applied between terminals A and K, transistors 140 and 130 turn on. Subsequently, SCR 180, defined by p-n-p-n regions 118, 116, 114 and 112, is triggered into a snap-back mode. The triggering of SCR 170 or SCR 180 into a snap-back mode results in the formation of a very low impedance path between terminals A and K to discharge the ESD current. FIG. 3, a reproduction of FIG. 6 of the '634 patent, shows the current-voltage characteristic of the ESD protection structure disclosed in the '634 patent. However, the structure is formed inside a silicon substrate with a deep n-well, and therefore must be manufactured by a mixed-mode CMOS process that supports a deep n-well fabrication processing step, rather than a general CMOS process.

SUMMARY OF THE INVENTION

In accordance with the invention, there is provided an electrostatic discharge protection device that includes a semiconductor substrate, an isolation structure formed inside the semiconductor substrate, a dielectric layer disposed over the semiconductor substrate and being in contact with the isolation structure, and a layer of silicon, formed over the dielectric layer, including a first p-type portion, a first n-type portion contiguous with the first p-type portion, a second p-type portion contiguous with the first p-type portion and the first n-type portion, a second n-type portion, a third p-type portion, a third n-type portion contiguous with the third p-type portion, and a fourth p-type portion contiguous with the third p-type portion and the third n-type portion, wherein at least one of the first p-type portion, second p-type portion, third p-type portion, fourth p-type portion, first n-type portion, second n-type portion, and third n-type portion overlaps the isolation structure to provide electrostatic discharge protection.

In one aspect, the layer of silicon further comprises a first buffer portion disposed between the second p-type portion and second n-type portion.

In another aspect, the layer of silicon further comprises a second buffer portion disposed between the second n-type portion and third p-type portion.

Also in accordance with the present invention, there is provided an integrated circuit that includes a first terminal, a second terminal, and an electrostatic discharge device coupled between the first terminal and the second terminal having a semiconductor substrate, an isolation structure formed inside the semiconductor substrate, a dielectric layer disposed over the semiconductor substrate and being in contact with the isolation structure, and a layer of silicon, formed over the dielectric layer, including a first p-type portion, a first n-type portion contiguous with the first p-type portion, a second p-type portion contiguous with the first p-type portion and the first n-type portion, a second n-type portion, a third p-type portion, a third n-type portion contiguous with the third p-type portion, and a fourth p-type portion contiguous with the third p-type portion and the third n-type portion, wherein the first p-type portion, second p-type portion, third p-type portion, fourth p-type portion, first n-type portion, second n-type portion, and third n-type portion overlap the isolation structure, and wherein the first p-type portion and first n-type portion are coupled to the first terminal, and the fourth p-type portion and third n-type portion are coupled to the second terminal.

Further in accordance with the present invention, there is provided a method for protecting a complementary metal-oxide semiconductor device from electrostatic discharge that includes providing a bi-directional silicon controlled rectifier in the complementary metal-oxide semiconductor circuit, isolating the bi-directional silicon controlled rectifier from a substrate of the complementary metal-oxide semiconductor circuit, providing a signal pad coupled to the bi-directional silicon controlled rectifier for receiving an electrostatic discharge, and protecting the device from the electrostatic discharge with the bi-directional silicon controlled rectifier.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

In accordance with the present invention, there is provided a bi-directional SCR formed in a silicon layer for ESD protection. The SCR may also be formed in a polysilicon layer (PSCR). The SCR or PSCR of the present invention is disposed over shallow trench isolations ("STIs") and is therefore electrically isolated from the substrate. Accordingly, the SCR or PSCR of the present invention is insensitive to substrate noise. Although the embodiments the SCR of the present invention are generally described as having been formed in a layer of polysilicon, one skilled in the art would understand that the SCR of the present invention may also be formed in a layer of silicon, such as in a silicon-on-insulator IC.

Figure 4:
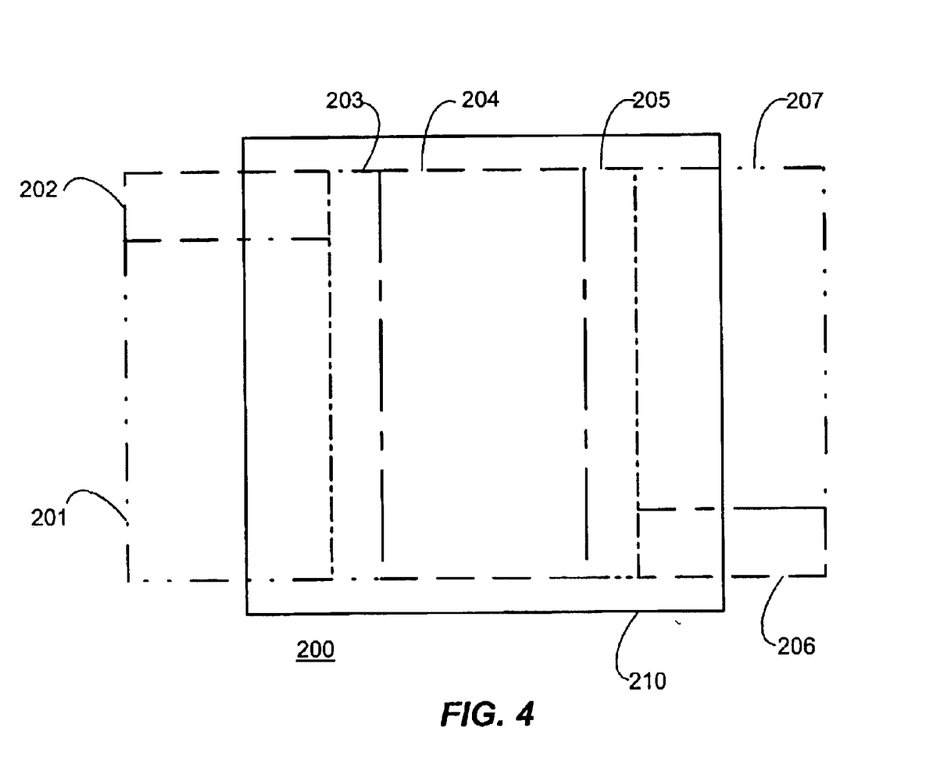
FIG. 4 shows a layout of a bi-directional SCR structure in accordance with one embodiment of the present invention.

FIG. 4 shows a layout of a bi-directional SCR structure consistent with one embodiment of the present invention. Referring to FIG. 4, an SCR 200 includes a first p-type portion 201, a first n-type portion 202 formed contiguous with the first p-type portion 201, a second p-type portion 203 formed contiguous with the first p-type portion 201 and the first n-type portion 202, a second n-type portion 204 contiguous with the second p-type portion 203, a third p-type portion 205 contiguous with the second n-type portion 204, a third n-type portion 206 and a fourth p-type portion 207 formed contiguous with the third p-type portion 205 and both contiguous with the third n-type portion 206. The SCR 200 is formed in a polysilicon layer 212. A resistance protection oxide (RPO) layer 210 may be formed over the SCR 200 to prevent polycide growth on the SCR 200.

Figure 5:
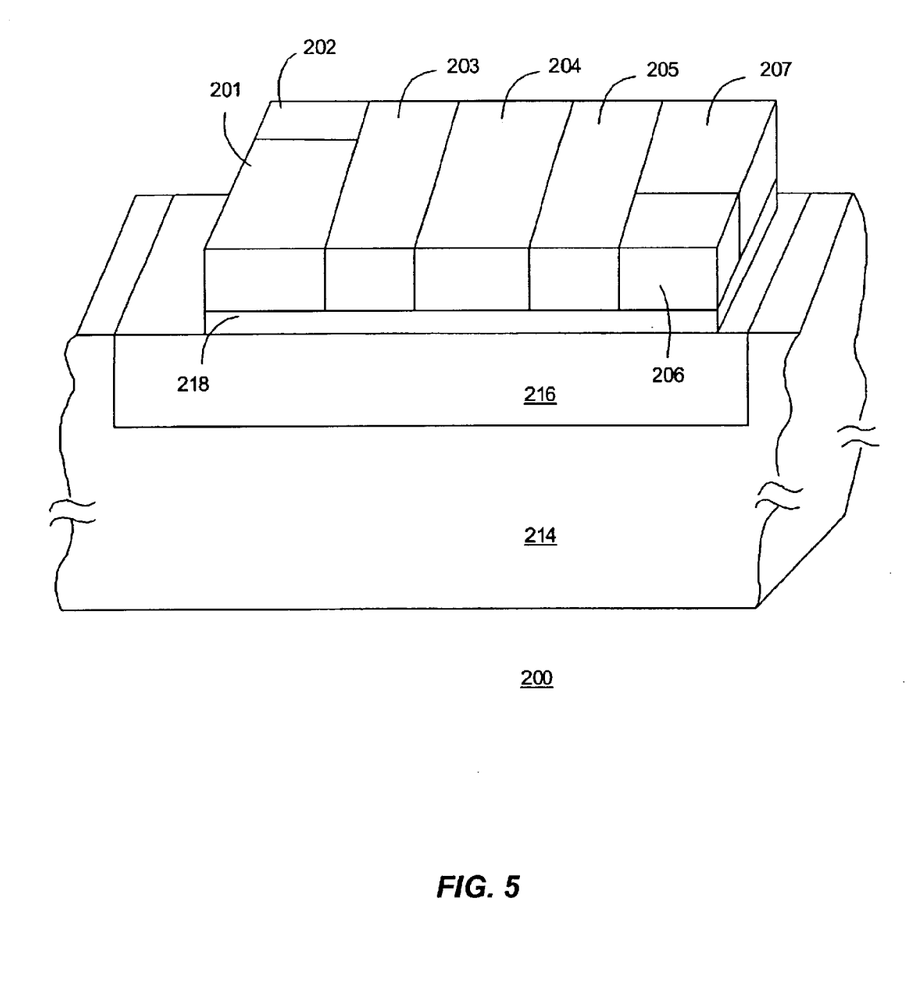
FIG. 5 shows a perspective view of the bi-directional SCR structure shown in FIG. 4.

FIG. 5 shows a perspective view of the SCR 200. Referring to FIG. 5, the SCR 200 is disposed over a dielectric layer 218. The dielectric layer 218 may be a gate dielectric layer and is disposed over an STI region 216 formed in a semiconductor substrate 214. In one embodiment of the invention, the semiconductor substrate 214 is a p-type substrate. The SCR 200 is electrically isolated from the semiconductor substrate 214 and therefore immune from substrate noise.

Figure 6:
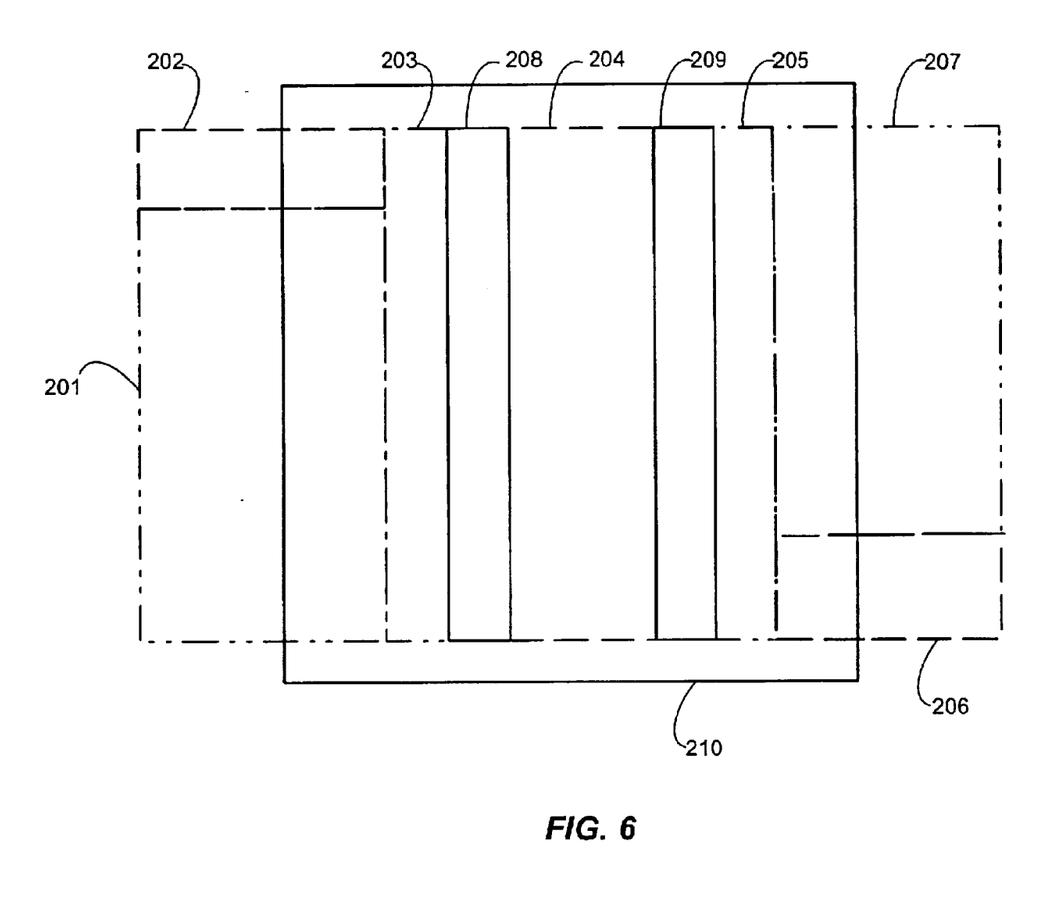
FIG. 6 shows a layout of a bi-directional SCR structure in accordance with another embodiment of the present invention.

FIG. 6 shows a layout of a bi-directional SCR structure consistent with another embodiment of the present invention. Referring to FIG. 6, an SCR 200 includes a first p-type portion 201, a first n-type portion 202 formed contiguous with the first p-type portion 201, a second p-type portion 203 formed contiguous with the first p-type portion 201 and the first n-type portion 202, a second n-type portion 204, a third p-type portion 205, a third n-type portion 206 and a fourth p-type portion 207 formed contiguous with the third p-type portion 205 and both contiguous with the third n-type portion 206.

The SCR 200 additionally includes a first buffer portion 208, and a second buffer portion 209. The first buffer portion 208 is disposed between and contiguous with the second p-type portion 203 and second n-type portion 204. In one embodiment, the first buffer portion 208 is doped with an n-type dopant and has a doped concentration lower than any of the first n-type portion 202, second n-type portion 204, or the third n-type portion 206. In another embodiment, the first buffer portion 208 is doped with a p-type dopant and has a doped concentration lower than any of the first p-type portion 201, second p-type portion 203, third p-type portion 205, or fourth p-type portion 207. In yet another embodiment, the first buffer portion 208 is undoped, i.e., intrinsic silicon.

Referring again to FIG. 6, the second buffer portion 209 is disposed between and contiguous with the second n-type portion 204 and third p-type portion 205. In one embodiment, the second buffer portion 209 is doped with an n-type dopant and has a doped concentration lower than any of the first n-type portion 202, second n-type portion 204, or third n-type portion 206. In another embodiment, the second buffer portion 209 is doped with a p-type dopant and has a doped concentration lower than any of the first p-type portion 201, second p-type portion 203, third p-type portion 205, or fourth p-type portion 207. In yet another embodiment, the second buffer portion 209 is undoped.

In operation, the SCR 200 with the first buffer portion 208, second buffer portion 209, or both of buffer portions 208 and 209, suppresses junction leakage current of the SCR 200 due to the difference in dopant concentration levels across the first buffer portion 208 or second buffer portion 209.

Figure 7:
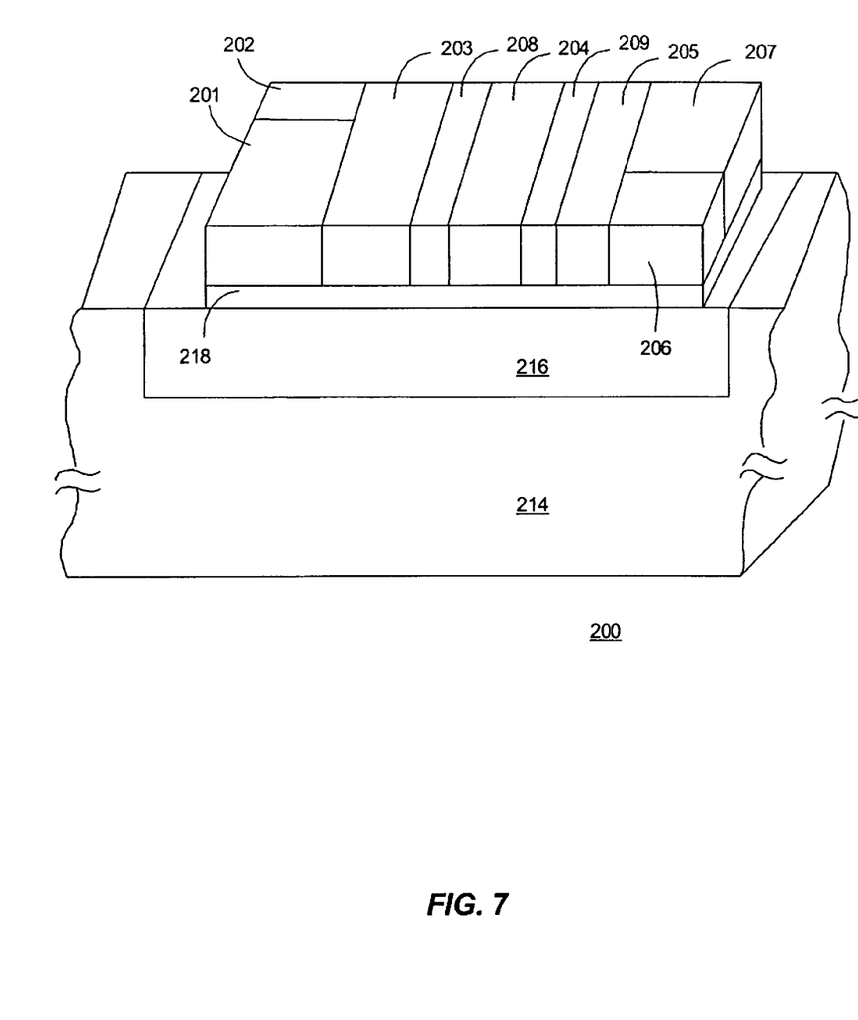
FIG. 7 shows a perspective view of the bi-directional SCR structure shown in FIG. 6.

A perspective view of the SCR 200 is shown in FIG. 7. Referring to FIG. 7, the SCR 200 is disposed over a dielectric layer 218. The dielectric layer 218 is disposed over an STI region 216 formed in a semiconductor substrate 214. The SCR 200 is electrically isolated from the semiconductor substrate 214 and therefore immune from substrate noise.

The bi-directional SCR of the present invention includes two terminals, across which an ESD current may flow. A first terminal is coupled to both the first p-type portion 201 and first n-type portion 202, and a second terminal is coupled to both the fourth p-type portion 207 and third n-type portion 206. In one embodiment, one terminal of the SCR is coupled to a voltage source, either a high voltage source VDD or a low voltage source VSS, and the other terminal is coupled to a signal pad for receiving an ESD current. Alternatively, one terminal is coupled to the high voltage source VDD and the other terminal is coupled to the low voltage source VSS. In yet another embodiment, one terminal is coupled to a first signal pad and the other terminal is coupled to a second signal pad. In operation, when an ESD event appears at one of the two terminals, a first SCR, comprising the first p-type portion 201, second p-type portion 203, second n-type portion 204, third p-type portion 205, and third n-type portion 206, functions to bypass a positive event from the first terminal to the second terminal, or a second SCR, comprising the fourth p-type portion 207, third p-type portion 205, second n-type portion 204, second p-type portion 203, and first n-type portion 202, functions to bypass a negative event from the second terminal to the first terminal.

The bi-directional SCR of the present invention may also be implemented in a silicon-on-insulator (SOI) CMOS integrated circuit. In an SOI CMOS device, an insulator is disposed over a semiconductor substrate. The bi-directional SCR of the present invention is then formed over the insulator in a silicon or polysilicon layer, with all of the embodiments described above and shown in FIGS. 4–7.

In operation, the insulator isolates devices in an SOI integrated circuit. Therefore, a method to protect a silicon-on-insulator device from electrostatic discharge includes providing a signal to the device through an SOI circuit. A bi-directional silicon controlled rectifier is then provided in the SOI circuit and isolated from a substrate of the SOI circuit. The polysilicon controlled rectifier then protects the SOI device from electrostatic discharge.

Figure 8:
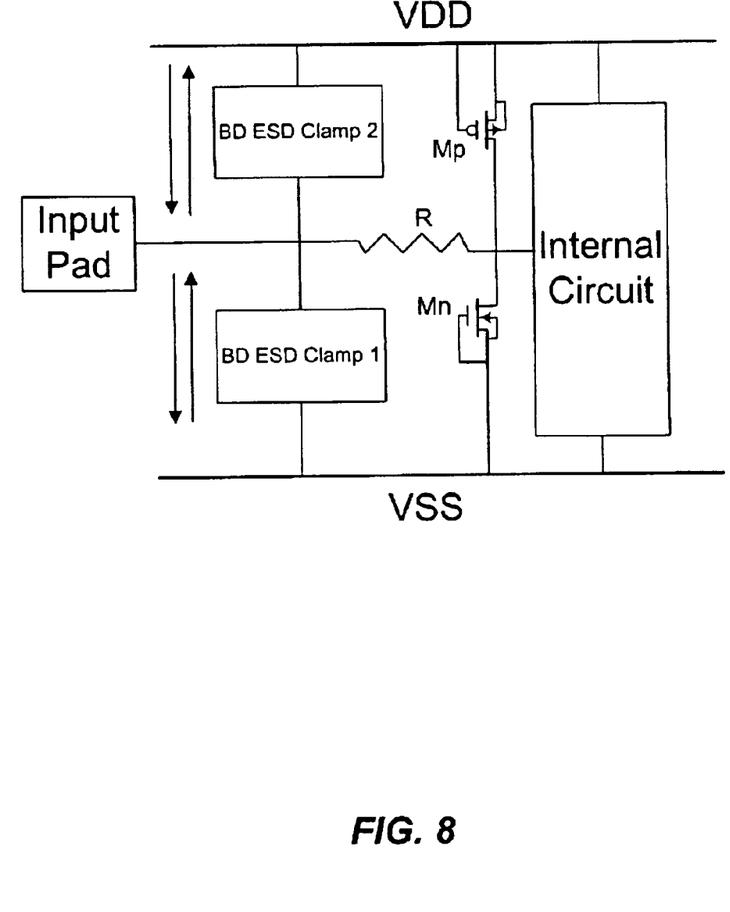
FIG. 8 is a circuit diagram of an ESD protection circuit using a bi-directional SCR of the inventions.

FIG. 8 is a circuit diagram of an ESD protection circuit with two bi-directional SCRs, BD ESD Clamp 1 and BD ESD Clamp 2. Referring to FIG. 8, each bi-directional SCR serves as a bi-directional ESD clamp to conduct an ESD current between an input pad and a designed ESD path. In operation, when an ESD event is applied to the input pad with the VSS relatively grounded, the ESD current triggers the BD ESD clamp 1, and the ESD current is conducted to ground by the BD ESD clamp 1.

Figure 9:
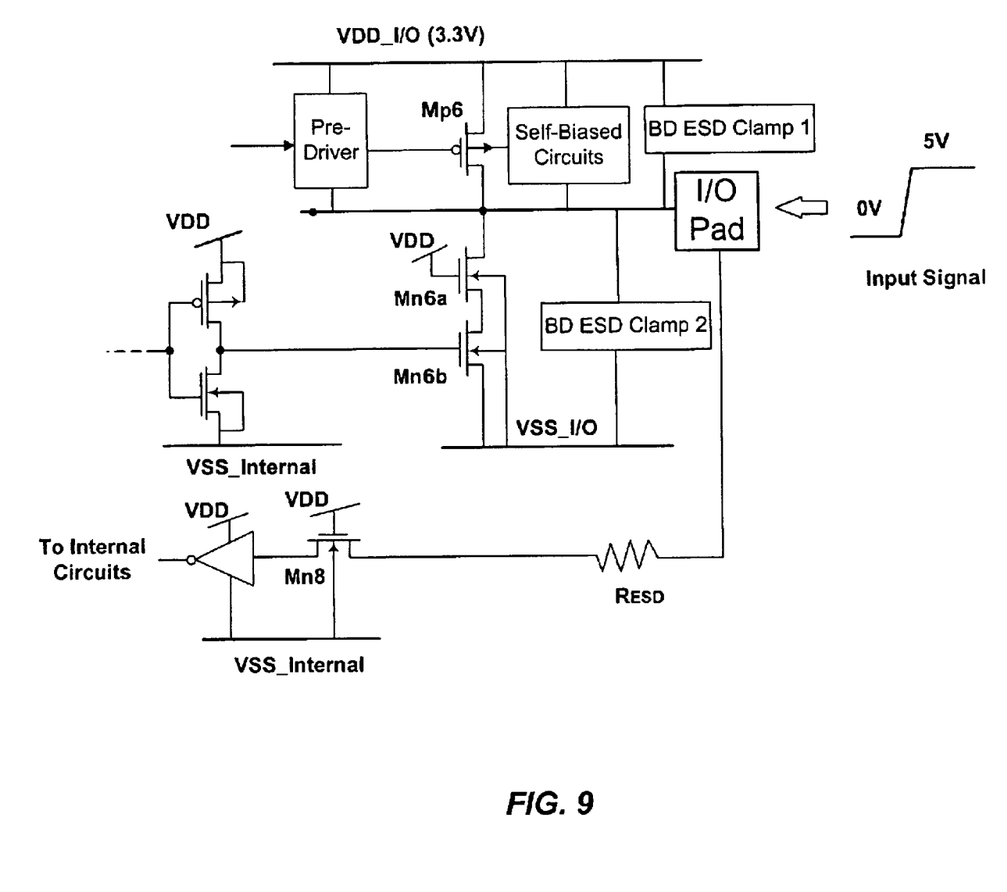
FIG. 9 is another circuit diagram of an ESD protection circuit using a bi-directional SCR of the invention.

The bi-directional SCR silicon controlled rectifier may additionally be implemented in ESD clamp circuits inside a high-voltage tolerant I/O circuit as shown in FIG. 9. Such high-voltage tolerant I/O circuits are known and have been described in "A Versatile 3.3/2.5/1.8-V CMOS I/O Driver Built in a 0.2-$\mu$m, 3.5-nm Tox, 1.8-V CMOS Technology," by Sanchez et al., *IEEE Journal of Solid-State Circuits*, Vol. 34, No. 11, pp. 1501–11 (November 1999), and "High-Voltage-Tolerant I/O Buffers with Low-Voltage CMOS Process," by Singh et al, Id. at pp. 1512–25, and are incorporated by reference.

Therefore, the present invention also includes a method for protecting a CMOS semiconductor device from electrostatic discharge. The method provides a signal to the device through a CMOS circuit and a bi-directional silicon controlled rectifier in the complementary metal-oxide semiconductor circuit. The bi-directional silicon controlled rectifier is isolated from a substrate of the CMOS device.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrostatic discharge protection device, comprising:

a semiconductor substrate;

an isolation region formed inside the semiconductor substrate;

a dielectric layer disposed over the semiconductor substrate and being in contact with the isolation structure; and a layer of silicon, formed over the dielectric layer, including a first p-type portion, a first n-type portion contiguous with the first p-type portion, a second p-type portion contiguous with the first p-type portion and the first n-type portion, a second n-type portion, a third p-type portion, a third n-type portion contiguous with the third p-type portion, and a fourth p-type portion contiguous with the third p-type portion and the third n-type portion, wherein at least one of the first p-type portion, second p-type portion, third p-type portion, fourth p-type portion, first n-type portion, second n-type portion, and third n-type portion overlaps the isolation region to provide electrostatic discharge protection.

2. The device as claimed in claim 1, wherein the second n-type portion is contiguous with the second p-type portion.

3. The device as claimed in claim 1, wherein the third p-type portion is contiguous with the second n-type portion.

4. The device as claimed in claim 1, wherein the layer of silicon further comprises a first buffer portion disposed between the second p-type portion and second n-type portion.

5. The device as claimed in claim 4, wherein the first buffer portion of the layer of silicon is doped with an n-type impurity having a doped concentration lower than one of the first n-type portion, second n-type portion, or third n-type portion.

6. The device as claimed in claim 4, wherein the first buffer portion of the layer of silicon is doped with a p-type impurity having a doped concentration lower than one of the first p-type portion, second p-type portion, third p-type portion, or fourth p-type portion.

7. The device as claimed in claim 4, wherein the first buffer portion of the layer of silicon is undoped.

8. The device as claimed in claim 1, wherein the layer of silicon further comprises a second buffer portion disposed between the second n-type portion and third p-type portion.

9. The device as claimed in claim 8, wherein the second buffer portion of the layer of silicon is doped with an n-type impurity having a doped concentration lower than one of the first n-type portion, second n-type portion, or third n-type portion.

10. The device as claimed in claim 8, wherein the second buffer portion of the layer of silicon is doped with a p-type impurity having a doped concentration lower than one of the first p-type portions second p-type portion, third p-type portion, or fourth p-type portion.

11. The device as claimed in claim 8, wherein the second buffer portion of the layer of silicon is undoped.

12. The device as claimed in claim 1, wherein all of the first p-type portion, second p-type portion, third p-type portion, fourth p-type portion, first n-type portion, second n-type portion, and third n-type portion overlap the isolation structure to provide electrostatic discharge protection.

13. The device as claimed in claim 1, wherein the layer of silicon is comprised of polysilicon.

14. An integrated circuit, comprising:

a first terminal;

a second terminal; and an electrostatic discharge device coupled between the first terminal and the second terminal, comprising a semiconductor substrate;

an isolation region formed inside the semiconductor substrate;

a dielectric layer disposed over the semiconductor substrate and being in contact with the isolation structure; and a layer of silicon, formed over the dielectric layer, including a first p-type portion, a first n-type portion contiguous with the first p-type portion, a second p-type portion contiguous with the first p-type portion and the first n-type portion, a second n-type portion, a third p-type portion, a third n-type portion contiguous with the third p-type portion, and a fourth p-type portion contiguous with the third p-type portion and the third n-type portion.

wherein the first p-type portion, second p-type portion, third p-type portion, fourth p-type portion, first n-type portion, second n-type portion, and third n-type portion overlap the isolation region; and wherein the first p-type portion and first n-type portion are coupled to the first terminal, and the fourth p-type portion and third n-type portion are coupled to the second terminal.

15. The integrated circuit as claimed in claim 14, wherein the first terminal is coupled to a voltage source and the second terminal is coupled to a signal pad.

16. The integrated circuit as claimed in claim 14, wherein the first terminal is coupled to a VDD source and the second terminal is coupled to a VSS source.

17. The integrated circuit as claimed in claim 14, wherein the first terminal is coupled to a first signal pad and the second terminal is coupled to a second signal pad.

18. The integrated circuit as claimed in claim 14, wherein the layer of silicon further comprises a first buffer portion disposed between the second p-type portion and second n-type portion.

19. The integrated circuit as claimed in claim 14, wherein the layer of silicon further comprises a second buffer portion disposed between the second n-type portion and third p-type portion.

* * * * *